United States Patent
Shimosawa

(10) Patent No.: US 11,569,372 B2
(45) Date of Patent: Jan. 31, 2023

(54) SEMICONDUCTOR DEVICE

(71) Applicant: FUJI ELECTRIC CO., LTD., Kawasaki (JP)

(72) Inventor: Makoto Shimosawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/118,044

(22) Filed: Dec. 10, 2020

(65) Prior Publication Data

US 2021/0098613 A1 Apr. 1, 2021

Related U.S. Application Data

(62) Division of application No. 16/459,159, filed on Jul. 1, 2019, now Pat. No. 10,886,390.

(30) Foreign Application Priority Data

Aug. 30, 2018 (JP) .............................. JP2018-161093

(51) Int. Cl.
*H01L 29/66* (2006.01)
*H01L 29/73* (2006.01)
(Continued)

(52) U.S. Cl.
CPC ........ *H01L 29/7397* (2013.01); *H01L 21/022* (2013.01); *H01L 21/02129* (2013.01);
(Continued)

(58) Field of Classification Search
CPC . H01L 21/02; H01L 21/02129; H01L 21/022; H01L 21/02255; H01L 21/0271;
(Continued)

(56) References Cited

U.S. PATENT DOCUMENTS 5,726,083 A 3/1998 Takaishi
5,801,408 A 9/1998 Takahashi
(Continued)

FOREIGN PATENT DOCUMENTS

JP H04-246845 A 9/1992
JP H07-240461 A 9/1995
(Continued)

OTHER PUBLICATIONS

Office Action of Japanese Patent Application No. 2018-161093 dated May 24, 2022.
(Continued)

*Primary Examiner* — Fazli Erdem
(74) *Attorney, Agent, or Firm* — Rabin & Berdo, P.C.

(57) ABSTRACT

Semiconductor device including first semiconductor layer of a first conductivity type, second semiconductor layer of a second conductivity type at a surface of the first semiconductor layer, third semiconductor layer of the first conductivity type selectively provided at a surface of the second layer, and gate electrode embedded in a trench via a gate insulating film. The trench penetrates the second and third layers, and reaches the first layer. A thermal oxide film on the third layer has a thickness less than that of the gate insulating film. Also are an interlayer insulating film on the thermal oxide film, barrier metal on an inner surface of a contact hole selectively opened in the thermal oxide film and the interlayer insulating film, metal plug embedded in the contact hole on the barrier metal, and electrode electrically connected to the second and third layers via the barrier metal and the metal plug.

7 Claims, 15 Drawing Sheets

(51) Int. Cl.
*H01L 29/739* (2006.01)
*H01L 21/02* (2006.01)
*H01L 29/10* (2006.01)
*H01L 29/423* (2006.01)
*H01L 29/78* (2006.01)
*H01L 29/06* (2006.01)

(52) U.S. Cl.
CPC .. *H01L 21/02164* (2013.01); *H01L 21/02255* (2013.01); *H01L 21/02271* (2013.01); *H01L 29/0696* (2013.01); *H01L 29/1095* (2013.01); *H01L 29/42364* (2013.01); *H01L 29/7813* (2013.01)

(58) Field of Classification Search
CPC ....... H01L 29/66; H01L 29/73; H01L 29/739; H01L 29/7397; H01L 29/06; H01L 29/0696; H01L 29/10; H01L 29/1095; H01L 29/42; H01L 29/42364; H01L 29/78; H01L 29/7813
USPC ........................................................ 257/330
See application file for complete search history.

(56) References Cited

U.S. PATENT DOCUMENTS

| | | | |
|---|---|---|---|
| 6,177,343 B1 | 1/2001 | Watanabe et al. | |
| 2009/0114982 A1 | 5/2009 | Saka et al. | |
| 2012/0292662 A1 | 11/2012 | Matsuura et al. | |
| 2016/0172301 A1* | 6/2016 | Iwasaki | H01L 29/7397 438/653 |
| 2017/0110573 A1* | 4/2017 | Laforet | H01L 29/0696 |
| 2017/0263753 A1 | 9/2017 | Moriya et al. | |
| 2018/0061652 A1 | 3/2018 | Tateyama | |
| 2018/0151711 A1 | 5/2018 | Yamada | |
| 2018/0158946 A1 | 6/2018 | Koga | |

FOREIGN PATENT DOCUMENTS

| | | |
|---|---|---|
| JP | H08-31932 A | 2/1996 |
| JP | H08-153857 A | 6/1996 |
| JP | H09-312339 A | 12/1997 |
| JP | 3384198 B2 | 3/2003 |
| JP | 2008098593 A | 4/2008 |
| JP | 2009238872 A | 10/2009 |
| JP | 2011171632 A | 9/2011 |
| JP | 2017-163107 A | 9/2017 |
| JP | 2018-032722 A | 3/2018 |
| JP | 2018093067 A | 6/2018 |

OTHER PUBLICATIONS

Japanese Office Action dated Oct. 18, 2022, for the corresponding Japanese patent application No. 2018-161093.

* cited by examiner

SEMICONDUCTOR DEVICE

CROSS REFERENCE TO RELATED APPLICATIONS

This application is a divisional of U.S. application Ser. No. 16/459,159, filed on Jul. 1, 2019, and is based upon and claims the benefit of priority of the prior Japanese Patent Application No. 2018-161093, filed on Aug. 30, 2018, the entire contents of which are incorporated herein by reference.

BACKGROUND OF THE INVENTION

1. Field of the Invention

Embodiments of the invention relate to a method of manufacturing a semiconductor device and a semiconductor device.

2. Description of the Related Art

Power semiconductor devices have a central role in power converting equipment for various purposes such as industrial machines or electric vehicles, and expectations are high for reduced power consumption of such power semiconductor devices. Among power semiconductor devices, insulated gate bipolar transistors (IGBTs) may achieve low ON voltage through a conductivity modulation effect and due to the ease of controlling voltage driving by gate control, the use of IGBTs is firmly established. In particular, in a trench-gate IGBT in which a gate electrode is formed in a trench provided at a surface of a silicon (Si) wafer, a density (total channel length) of an inversion layer (channel) of electrons may be increased, whereby the ON voltage may be reduced.

FIG. 15 is a cross-sectional view of a structure of a conventional trench-gate IGBT. As depicted in FIG. 15, a p-type base layer 105 is provided in a first surface layer of a silicon substrate that has an $n^-$-type drift layer 101; an $n^+$-type field stop layer (hereinafter, FS layer) 103 is provided in a second surface layer; and a $p^+$-type collector layer 102 is provided in a surface layer of the $n^+$-type FS layer 103 (hereinafter, a side where the p-type base layer 105 is provided is defined as a front surface of the silicon substrate, and a side where the $p^+$-type collector layer 102 is provided is defined as a rear surface of the silicon substrate). Plural trenches 118 are provided that penetrate the p-type base layer 105 from a front surface side of the silicon substrate in a depth direction and reach the $n^-$-type drift layer 101.

An $n^{++}$-type emitter region 106 is selectively provided in the p-type base layer 105. Further, a $p^{++}$-type contact region 107 is further provided selectively in the p-type base layer 105, so as to be adjacent to the $n^{++}$-type emitter regions 106. Along side walls of the trenches 118, in portions of the p-type base layer 105, an n-type inversion layer constituting a current path of a main current is formed during an ON state.

An emitter electrode 111 is conductively connected to the $p^{++}$-type contact region 107 and the $n^{++}$-type emitter region 106 via a contact hole provided in an interlayer insulating film 110. A collector electrode 112 is conductively connected to the $p^+$-type collector layer 102, at a rear surface side of the silicon substrate. A gate electrode 109 is provided in each of the trenches 118 via a gate insulating film 108.

A method of forming the emitter electrode 111 will be described in detail herein. The interlayer insulating film 110 is formed in the first surface layer of the silicon substrate; a portion of the interlayer insulating film 110 is etched, forming the contact hole; and a metal member such as a metal plug 115 is inserted in the contact hole, whereby a connector is formed. The metal plug 115, for example, is a tungsten plug. In the past, there was a structure in which the silicon substrate was connected directly with an aluminum (Al) electrode that constituted the emitter electrode 111. However, when the contact hole became narrow due to size reductions, at the Al electrode that was mainly formed by a sputtering method, favorable contact with the silicon substrate could not be established. Therefore, a structure was adopted in which a metal member such as a tungsten plug is inserted in the contact hole; the silicon substrate and the tungsten (W) are connected at a bottom of the contact hole; and the W and the Al electrode are connected at a top of the contact hole.

Here, as a method of depositing W and forming the tungsten plug, a chemical vapor deposition (CVD) method may be used. In this case, in many instances a reduction reaction of tungsten hexafluoride ($WF_6$) gas and hydrogen ($H_2$) gas is used, forming a W film. Here, the $WF_6$ gas etches the silicon substrate and a silicon oxide ($SiO_2$) film constituting the interlayer insulating film 110 and therefore, when the $WF_6$ gas is used and W is deposited, a barrier metal 114 is provided so that the silicon substrate and the $SiO_2$ film are not etched. The barrier metal 114, in many instances, is a titanium (Ti)-based film formed by a sputtering method, and in many instances, contact resistance is controlled to be within a predetermined range by forming a silicide using film thickness control and heating control after the sputtering.

Further, in a commonly known structure of the trench-gate IGBT, a $SiO_2$ gate insulating film is formed by a thermal oxide film formed at a surface of a silicon substrate by a thermal oxidation method of oxidizing a portion of the silicon substrate, and depositing on the $SiO_2$ gate insulating film, an interlayer insulating film made of a silicate glass containing boron and phosphorous (for example, refer to Japanese Patent No. 3384198). Further, it is commonly known that, for example, tungsten is used in a contact plug; an interlayer insulating film is constituted by a lower interlayer insulating film and an upper interlayer insulating film; in the lower interlayer insulating film, for example, a high temperature oxide (HTO) is used; and in the upper interlayer insulating film, for example, a boron phosphorous silicon glass (BPSG) is used (for example, refer to Japanese Laid-Open Patent Publication No. 2017-163107).

SUMMARY OF THE INVENTION

According to an embodiment of the present invention, a method of manufacturing a semiconductor device includes forming a gate insulating film at a first surface of a first semiconductor layer of a first conductivity type; forming a second semiconductor layer of a second conductivity type at the first surface of the first semiconductor layer; selectively forming a gate electrode on the gate insulating film; selectively removing the gate insulating film; forming a thermal oxide film at a surface of the second semiconductor layer by performing a heat treatment in an oxygen atmosphere; selectively forming a third semiconductor layer of the first conductivity type at the surface of the second semiconductor layer; forming an interlayer insulating film on the thermal oxide film; forming a contact hole selectively opened in the thermal oxide film and the interlayer insulating film; forming in the contact hole, a barrier metal that lines the contact hole; embedding a metal plug in the barrier metal by a CVD method that uses a metal halide; and forming a first electrode electrically connected to the third semiconductor layer and the second semiconductor layer, via the barrier metal and the metal plug.

In the embodiment, the method further includes forming a trench at the first surface of the first semiconductor layer before forming the gate insulating film. Forming the gate insulating film includes forming the gate insulating film at the first surface of the first semiconductor layer and in the trench. Selectively forming the gate electrode includes forming the gate electrode in the trench. Selectively removing the gate insulating film includes selectively removing the gate insulating film at the front surface of the first semiconductor layer.

In the embodiment, selectively forming the third semiconductor layer is performed after selectively forming the gate electrode or after forming the thermal oxide film.

In the embodiment, forming the thermal oxide film includes forming the thermal oxide film to be thinner than the gate insulating film.

In the embodiment, forming the interlayer insulating film includes forming the interlayer insulating film by any one of a HTO, a BPSG film, and a stacked layer structure of the HTO film and the BPSG film.

In the embodiment, embedding the metal plug includes embedding the metal plug in the barrier metal by the CVD method that uses at least one metal halide of $WF_6$, $WCl_6$, $MoF_6$, and $MoCl_6$.

In the embodiment, in forming the thermal oxide film, the thermal oxide film has a film thickness that is at most 200 nm. In selectively forming the third semiconductor layer, the third semiconductor layer is formed by implanting phosphorus (P).

In the embodiment, in forming the thermal oxide film, the thermal oxide film has a film thickness that is at most 50 nm. In selectively forming the third semiconductor layer, the third semiconductor layer is formed by implanting arsenic (As).

In the embodiment, the method further includes forming a fourth semiconductor layer of the second conductivity type at a second surface of the first semiconductor layer, the second surface being different from the first surface; and forming a second electrode electrically connected to the fourth semiconductor layer.

In the embodiment, the contact hole is a groove having a striped shape.

According to another embodiment of the present invention, a semiconductor device includes a first semiconductor layer of a first conductivity type; a second semiconductor layer of a second conductivity type and provided at a first surface of the first semiconductor layer; a third semiconductor layer of the first conductivity type and selectively provided at a surface of the second semiconductor layer; a trench that penetrates the third semiconductor layer and the second semiconductor layer, and reaches the first semiconductor layer; a gate electrode provided in the trench, via a gate insulating film; a thermal oxide film provided on the third semiconductor layer; an interlayer insulating film provided on the thermal oxide film; a barrier metal that lines a contact hole that is selectively opened in the thermal oxide film and the interlayer insulating film; a metal plug embedded in the barrier metal; and a first electrode electrically connected to the third semiconductor layer and the second semiconductor layer, via the barrier metal and the metal plug. The thermal oxide film is thinner than the gate insulating film.

In the embodiment, the interlayer insulating film is any one of a HTO film, a BPSG film, and a stacked layer structure of the HTO film and the BPSG film.

In the embodiment, the semiconductor device further includes a fourth semiconductor layer of the second conductivity type and provided at a second surface of the first semiconductor layer, the second surface being different from the first surface; and a second electrode electrically connected to the fourth semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Figure 15:
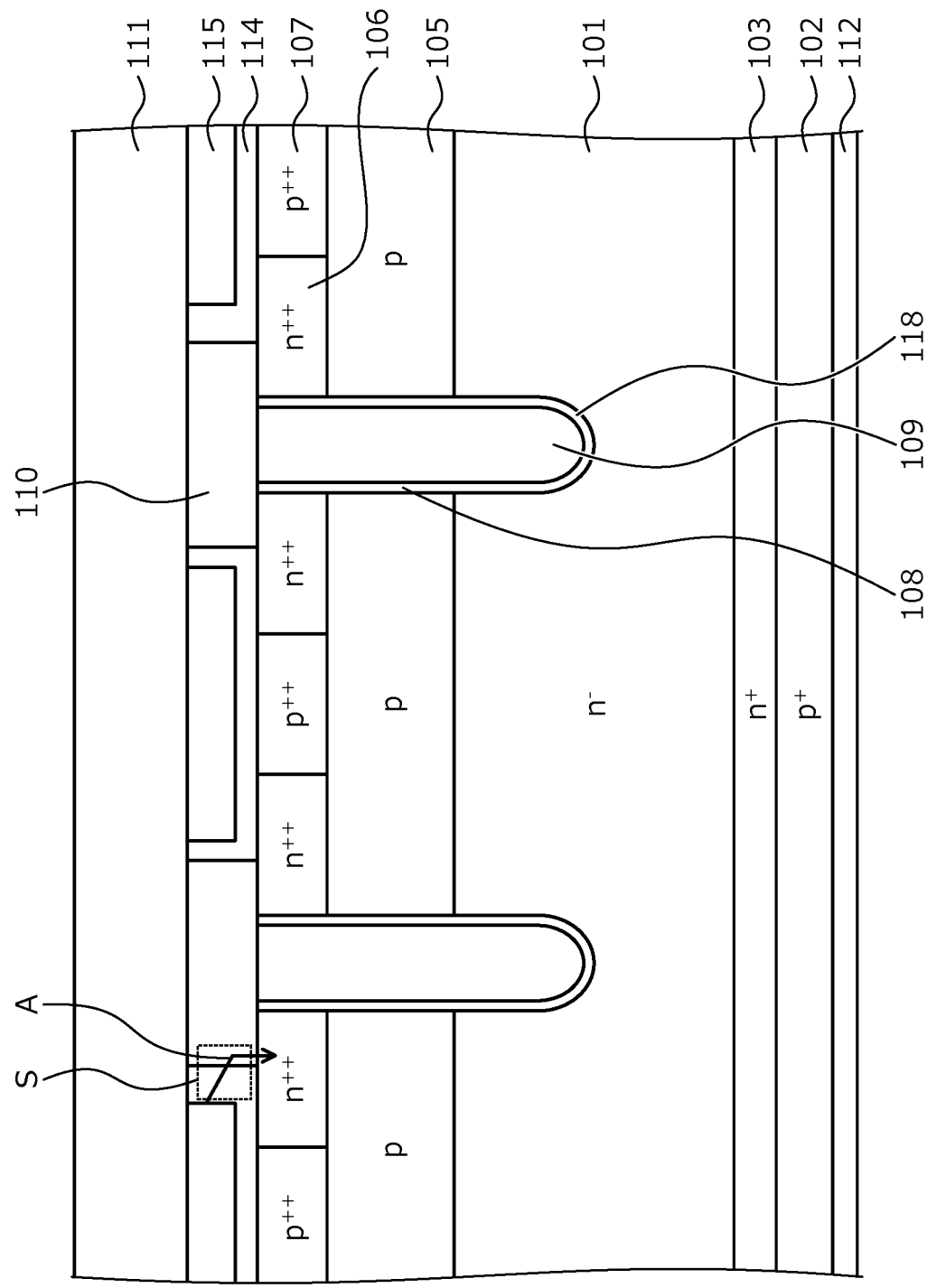
FIG. 15 is a cross-sectional view of a structure of a conventional trench-gate IGBT.

First, problems associated with the related techniques will be described. Here, by a heating process after sputtering, the barrier metal 114 at the bottom of the contact hole reacts with silicon (Si) and is converted into a silicide, whereby a film thickness becomes 2 to 3 times that before the heating process and a barrier property is ensured. Nonetheless, at a side wall (for example, a region S in FIG. 15) of the contact hole, there is substantially no reaction with the interlayer insulating film 110 and therefore, the film thickness remains thin and does not change from that before the heating process. Therefore, when the barrier metal 114 is formed by a sputtering process, in particular, the film thickness of the barrier metal 114 is often thin at the side wall. Further, as for film quality of the barrier metal 114 at the side wall, the film is often a relatively sparse film and from the perspective of film thickness and film quality, the region has a relatively weak barrier property.

In this state, when the tungsten plug is formed, at the region of the side wall of the contact hole where the barrier property of the barrier metal 114 is weak, the interlayer insulating film 110 may be etched by the WF$_6$ gas or the like. In particular, when a BPSG film is used for the interlayer insulating film 110, the amount of etching may be large due to a presence of moisture adsorbed in the BPSG film. As depicted by arrow A in FIG. 15, when this etching progresses and the WF$_6$ gas reaches the silicon substrate, the WF$_6$ gas and Si react, and the silicon substrate may also be etched. As a result, electrical characteristics of the semiconductor device may be remarkably impaired and yield of the semiconductor device degrades.

Embodiments of a method of manufacturing a semiconductor device and a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 1:
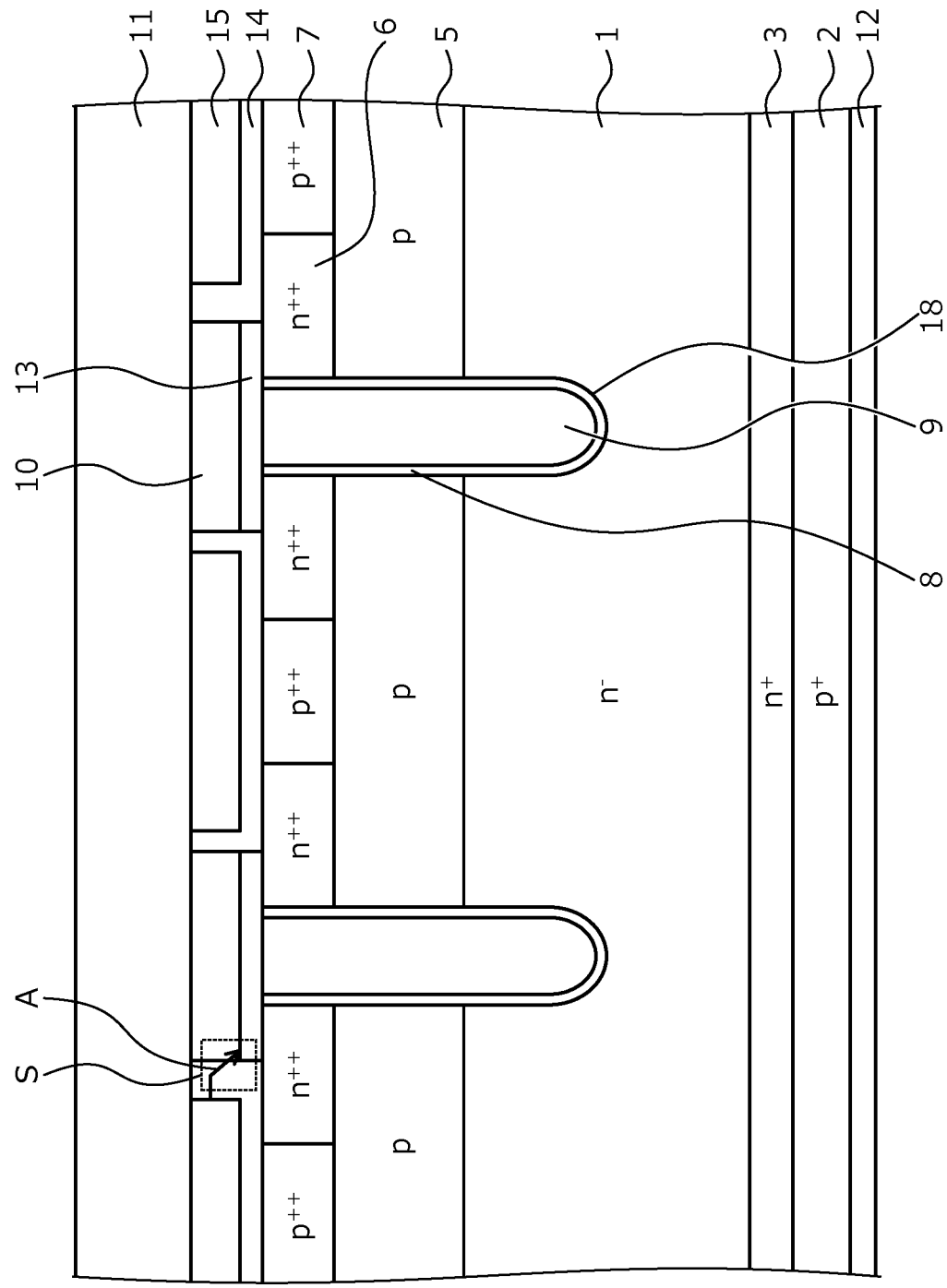
FIG. 1 is a cross-sectional view of a structure of the semiconductor device according to the embodiment.

A semiconductor device according to an embodiment of the present invention will be described taking a trench-gate IGBT as an example. FIG. 1 is a cross-sectional view of a structure of the semiconductor device according to the embodiment. In FIG. 1, only two unit cells (functional units of an element) are depicted, and other unit cells adjacent to these are not depicted. The IGBT depicted in FIG. 1 is an IGBT that includes a metal oxide semiconductor (MOS) gate at a front surface (surface on a p-type base layer 5 side) side of a semiconductor base (silicon base: semiconductor chip) that contains silicon and constitutes an n$^-$-type drift layer 1.

As depicted in FIG. 1, in the semiconductor device according to the embodiment, a p-type base layer (second semiconductor layer of a second conductivity type) 5 is selectively formed in a surface layer at a main surface (front surface) of an n$^-$-type drift layer (first semiconductor layer of a first conductivity type) 1. An n$^+$-type FS layer 3 is provided at a rear surface side of the n$^-$-type drift layer 1 and a p$^+$-type collector layer (fourth semiconductor layer of the second conductivity type) 2 is provided at a surface of the n$^+$-type FS layer 3.

A p$^{++}$-type contact region 7 and an n$^{++}$-type emitter region (third semiconductor layer of the first conductivity type) 6 are selectively provided in the p-type base layer 5. The n$^{++}$-type emitter region 6 is disposed next to the p$^{++}$-type contact region 7. The p$^{++}$-type contact region 7 may be deeper than the n$^{++}$-type emitter region 6. In a region adjacent to the n$^{++}$-type emitter region 6, a trench 18 that penetrates the p-type base layer 5 in a depth direction (direction toward a collector electrode 12) and reaches the n$^-$-type drift layer 1 is provided. For example, a gate electrode 9 that contains poly-silicon is embedded in the trench 18 via a gate insulating film 8 that is a thermal oxide film.

Further, on the gate electrode 9, a thermal oxide film 13 and an interlayer insulating film 10 for insulation from an emitter electrode 11 are stacked. The thermal oxide film 13 and the interlayer insulating film 10 may be provided on a portion of the n$^{++}$-type emitter region 6. In a contact hole selectively opened in the thermal oxide film 13 and in the interlayer insulating film 10, the emitter electrode 11 is electrically connected to the n$^{++}$-type emitter region 6, the p$^{++}$-type contact region 7, and the p-type base layer 5, via a barrier metal 14 and a metal plug 15. The emitter electrode 11 may be grounded and negative voltage may be applied to the emitter electrode 11. At a rear side of the semiconductor device, the collector electrode 12 that is electrically connected to the p$^+$-type collector layer 2 is provided. Positive voltage is applied to the collector electrode 12.

The barrier metal 14 lines the contact hole. The barrier metal 14 of the embodiment, for example, contains Ti, titanium nitride (TiN), tantalum (Ta), tantalum nitride (TaN), etc., or is constituted by a stacked layer thereof. The metal plug 15 is constituted by a metal different from that of the emitter electrode 11 and, for example, is a tungsten plug constituted by tungsten embedded in the barrier metal 14. The metal plug 15 may be a molybdenum plug constituted by molybdenum (Mo) embedded in the barrier metal 14.

In the IGBT of the embodiment, the thermal oxide film 13 formed by a thermal oxidation method of oxidizing a portion of the silicon substrate is provided between the silicon substrate and the interlayer insulating film 10. In FIG. 1, while the thermal oxide film 13 is further provided between the interlayer insulating film 10 and the gate electrode 9, the thermal oxide film 13 suffices to be between the silicon substrate and the interlayer insulating film 10, and may be omitted between the interlayer insulating film 10 and the gate electrode 9. In general, the thermal oxide film 13 is a film that is denser than an oxide film formed by a CVD method like a BPSG film and an etching rate for a halogen is greatly reduced. Therefore, the thermal oxide film 13 is provided between the silicon substrate (in FIG. 1, the n$^{++}$-type emitter region 6) and the interlayer insulating film 10, whereby at the side wall (for example, a region S in FIG. 1) of the contact hole, is a region where the film thickness of the barrier metal 14 is thin and the barrier property is relatively weak, and when the tungsten plug is formed as the metal plug 15, even if the interlayer insulating film 10 is etched by the WF$_6$ gas, etc., the thermal oxide film 13 for which the etching rate is much slower is present. Thus, as depicted by arrow A in FIG. 1, the amount of etching is significantly reduced due to the thermal oxide film 13 and the possibility that the WF$_6$ gas will reach the silicon substrate becomes significantly lower. As a result, in the IGBT of the embodiment, when the metal plug 15 is formed in the contact hole, the electrical characteristics of the semiconductor device are not impaired, the yield of the semiconductor device improves, and the yield rate may be maintained at a predetermined value.

Further, as described above, the thermal oxide film 13 has a function of deterring the WF$_6$ gas from reaching the silicon substrate and therefore, a film thickness thereof has to be such that the thermal oxide film 13 is not etched during formation of the metal plug 15. In particular, the thermal oxide film 13 has a film thickness of at least 1 nm. The thermal oxide film 13 has a further function of a screen oxide film for the ion implantation when the p-type base layer 5 is formed. For this function, the thermal oxide film 13 may have a film thickness of at least 10 nm.

Further, in terms of the function of deterring etching, a thick film thickness is not problematic; however, in terms of the function as a screen oxide film, when the film thickness is too thick, the efficiency of the ion implantation drops. Therefore, when the impurity that is ion-implanted is phosphorus (P), the thermal oxide film 13 is at most 200 nm and may be 120 nm or less with consideration of efficiency. On the other hand, when the impurity to be ion-implanted is arsenic (As), the thermal oxide film 13 has to be even thinner. In this case, the thermal oxide film 13 is at most 50 nm and may be 35 nm or less with consideration of efficiency. Further, the film thickness of the gate insulating film 8 may range from 100 nm to 150 nm, and the film thickness of the thermal oxide film 13 may be thinner than that of the gate insulating film 8.

As described hereinafter, in the method of manufacturing the semiconductor device, when the $n^{++}$-type emitter region 6, the $p^{++}$-type contact region 7, and the p-type base layer 5 are formed before the thermal oxide film 13 is formed, the function of the thermal oxide film 13 as a screen oxide film becomes unnecessary. In this case, no problem arises when the thermal oxide film 13 has a thick film thickness.

Figure 2:
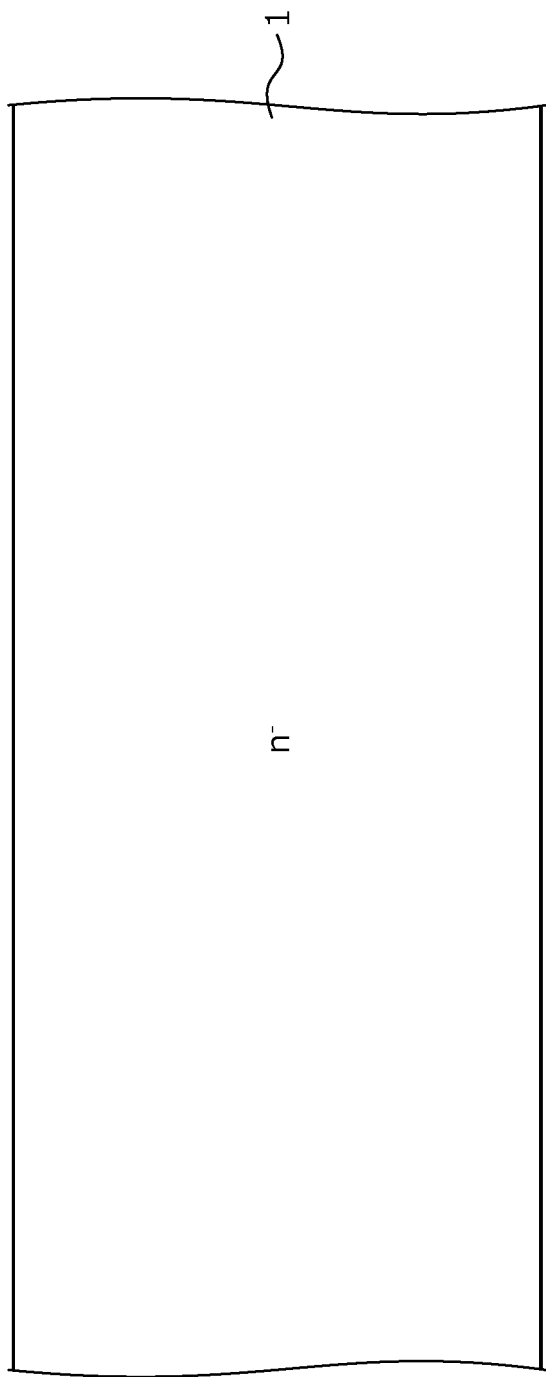
FIG. 2 is a cross-sectional view of the semiconductor device according to the embodiment during manufacture.

The method of manufacturing the semiconductor device according to the embodiment will be described. FIGS. 2, 3, 4, 5, 6, 7, 8, 9, 10, 11, 12, 13, and 14 are cross-sectional views of the semiconductor device according to the embodiment during manufacture. First, an $n^{-}$-type semiconductor substrate that constitutes the $n^{-}$-type drift layer 1 is prepared. A material of the $n^{-}$-type semiconductor substrate may be silicon or may be silicon carbide (SiC). Further, on the $n^{-}$-type semiconductor substrate, an $n^{-}$-type semiconductor layer may be formed on a front surface of the n-type semiconductor substrate. Hereinafter, a case in which the $n^{-}$-type semiconductor substrate is a silicon wafer will be described as an example. The state up to here is depicted in FIG. 2.

Figure 3:
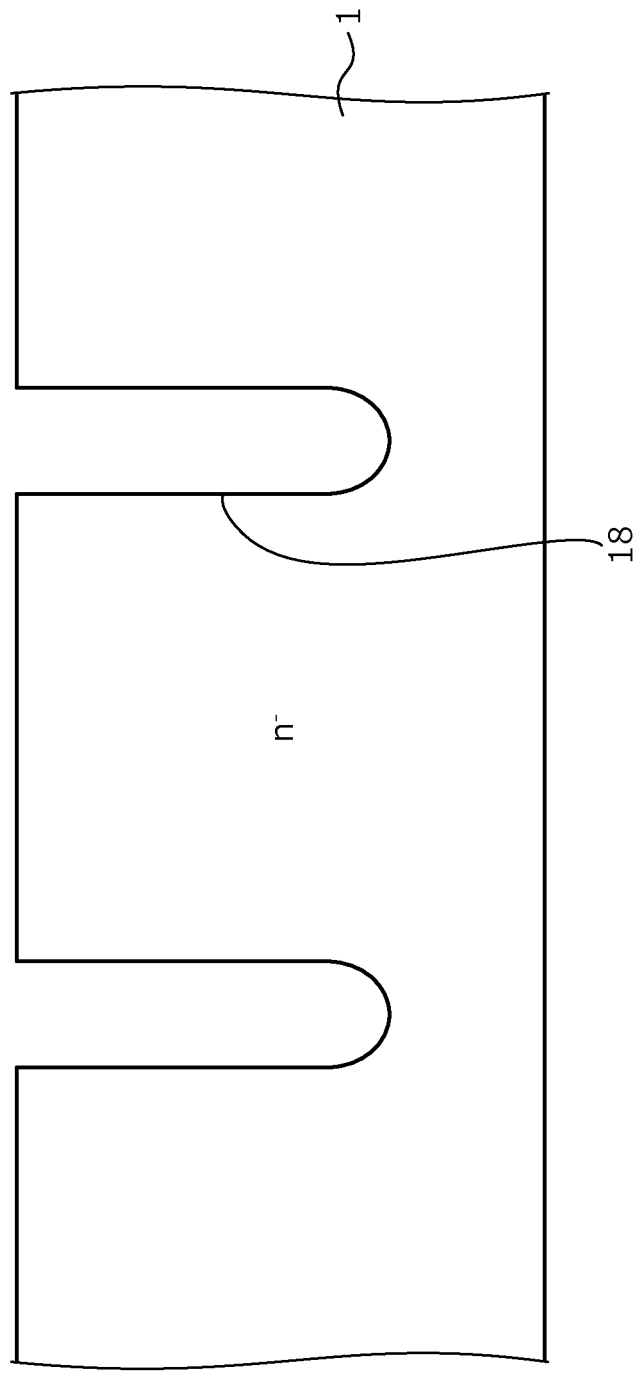
FIG. 3 is a cross-sectional view of the semiconductor device according to the embodiment during manufacture.
Figure 4:
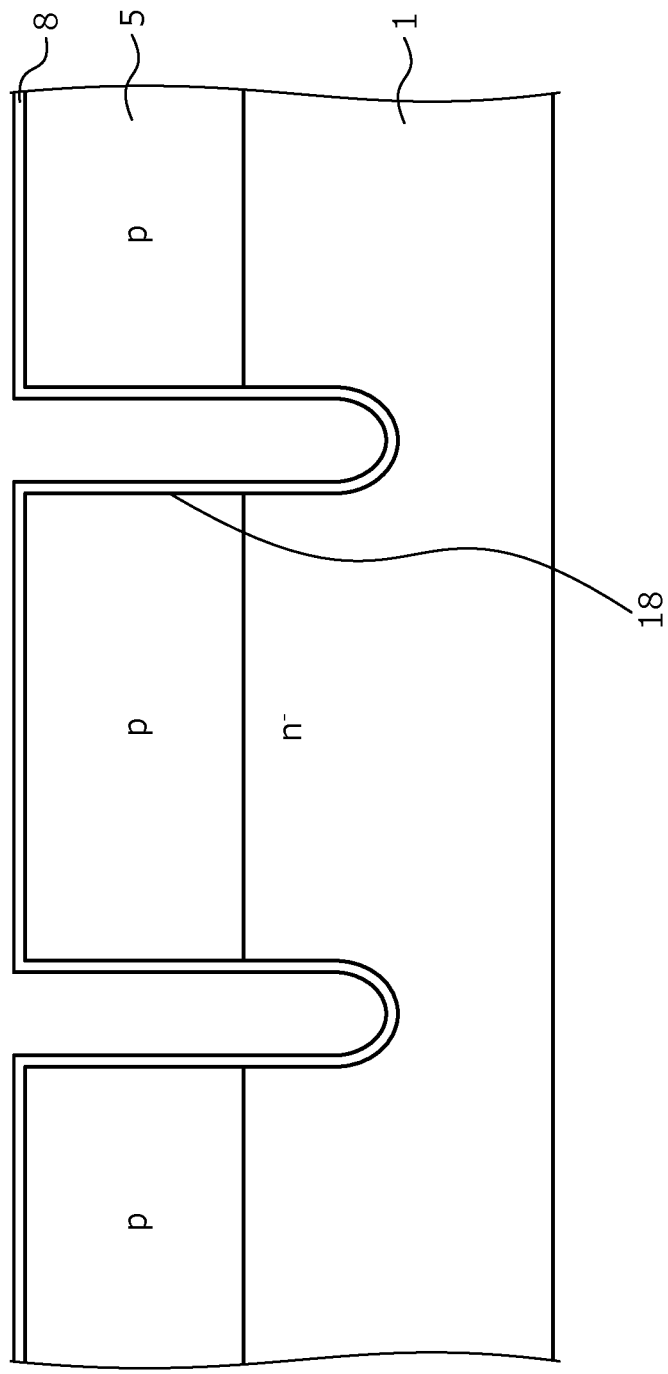
FIG. 4 is a cross-sectional view of the semiconductor device according to the embodiment during manufacture.

Next, the trench 18, which does not penetrate through the $n^{-}$-type drift layer 1, is formed by photolithography and etching. The trench 18, for example, is formed to a depth of 5 μm or less. The state up to here is depicted in FIG. 3. Next, for example, by thermal oxidation, the gate insulating film 8 is formed along the front surface of the $n^{-}$-type drift layer 1 and the inner wall of the trench 18. Next, by photolithography and ion implantation, a p-type impurity is implanted, forming the p-type base layer 5 at the front surface side of the $n^{-}$-type drift layer 1. The p-type impurity, for example, is B. The state up to here is depicted in FIG. 4.

Figure 5:
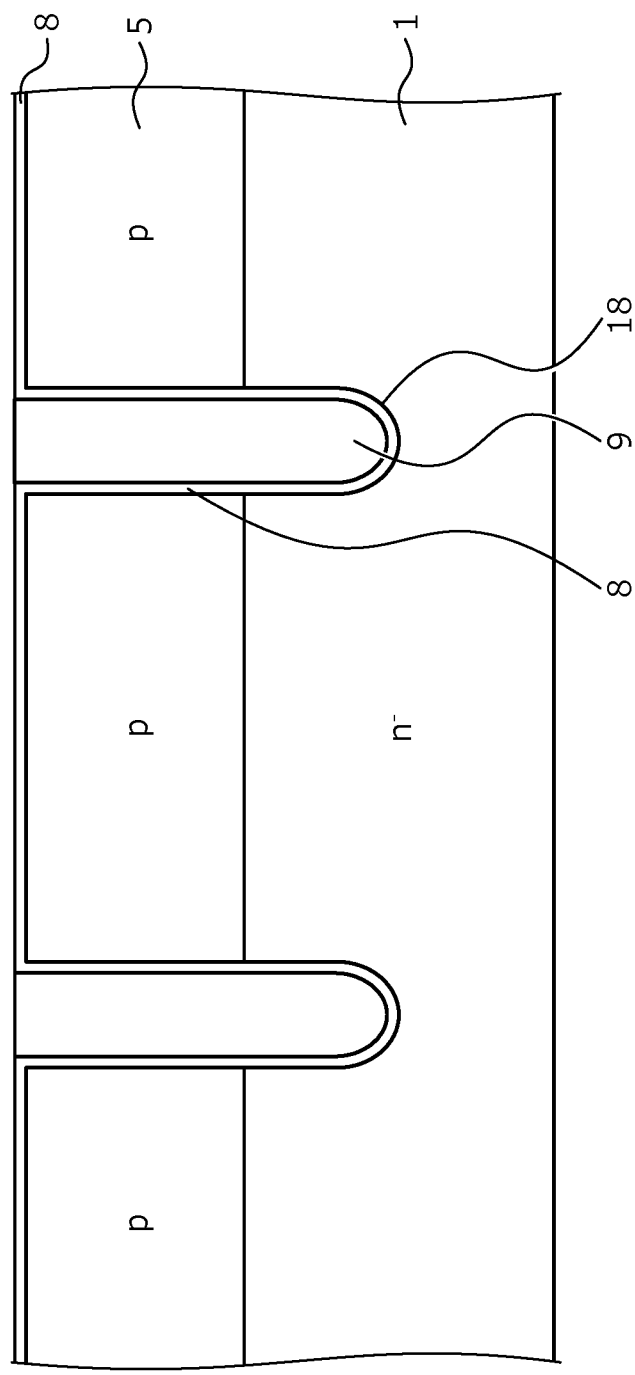
FIG. 5 is a cross-sectional view of the semiconductor device according to the embodiment during manufacture.

Next, on the front surface of the p-type base layer 5, the poly-silicon (poly-Si) layer is formed so as to be embedded in the trench 18. Next, the poly-silicon layer, for example, is etched, leaving in the trench 18, a portion that constitutes the gate electrode 9. The state up to here is depicted in FIG. 5.

Figure 6:
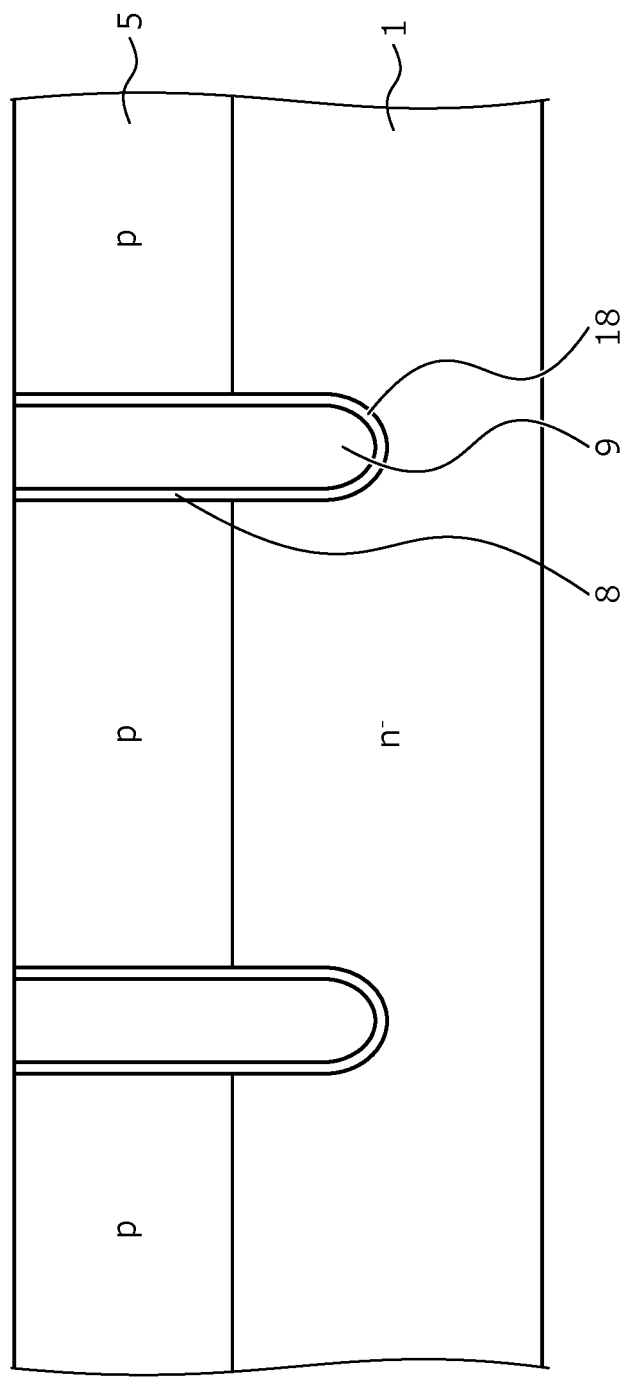
FIG. 6 is a cross-sectional view of the semiconductor device according to the embodiment during manufacture.

Next, the gate insulating film 8 formed on the front surface of the p-type base layer 5 is removed. During ion implantation, a heavy metal may penetrate the gate insulating film 8 due to ion-implantation equipment, and when the gate insulating film 8 in which a heavy metal has penetrated is left, the heavy metal diffuses during high-temperature (about 1000 degrees C.) annealing, defects are created in the p-type base layer 5 that forms a channel, and characteristics of the semiconductor device deteriorate. Therefore, before annealing, removal of the gate insulating film 8 is necessary and the gate insulating film 8 cannot be used in place of the thermal oxide film 13. The state up to here is depicted in FIG. 6.

Further, formation of the gate insulating film 8 after formation of the p-type base layer 5 and annealing is conceivable. In this case, removal of the gate insulating film 8 becomes unnecessary. Nonetheless, during formation of the gate insulating film 8, the p-type base layer 5 is affected by the gate insulating film 8 and therefore, control of the mathematical area and impurity concentration of the p-type base layer 5 has to be performed strictly, which is difficult and use of the gate insulating film 8 in place of the thermal oxide film 13 is not realistic.

Figure 7:
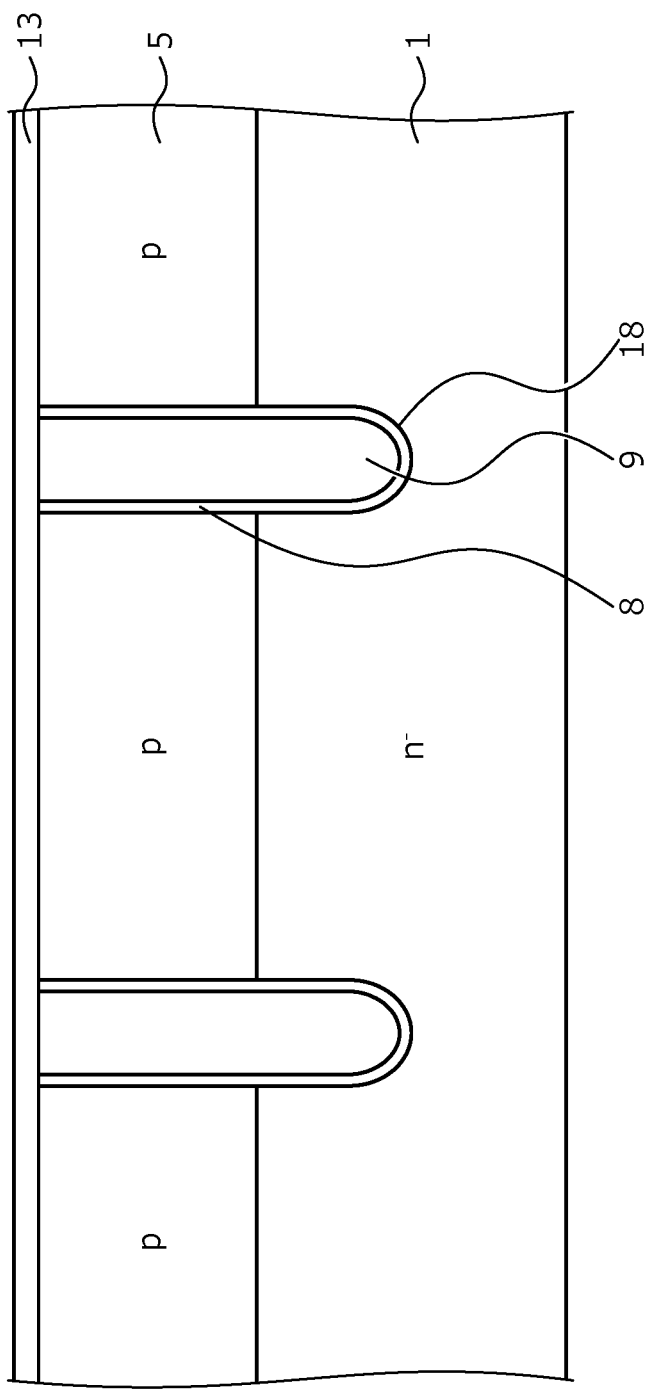
FIG. 7 is a cross-sectional view of the semiconductor device according to the embodiment during manufacture.

Next, in an oxygen ($O_2$) atmosphere, a heat treatment (annealing) is performed, whereby the thermal oxide film 13 is formed on the front surface of the p-type base layer 5. Oxidation includes dry oxidation using oxygen and steam oxidation using $H_2O$. In either method of manufacturing, the etching rate for a halogen is low and therefore, while either method of manufacturing may be used, with the dry oxidation, the denseness of the thermal oxide film may be expected to be higher and the etching rate may be expected to be reduced. Therefore, dry oxidation is advantageous for the oxidation. Further, the p-type impurity of the p-type base layer 5 may be activated and diffused by the heat treatment and continued heat treatment. The state up to here is depicted in FIG. 7.

Next, by photolithography and ion implantation, the $p^{++}$-type contact region 7 is selectively formed at a surface of the p-type base layer 5. Next, by photolithography and ion implantation, the $n^{++}$-type emitter region 6 is selective formed at the surface of the p-type base layer 5.

Figure 8:
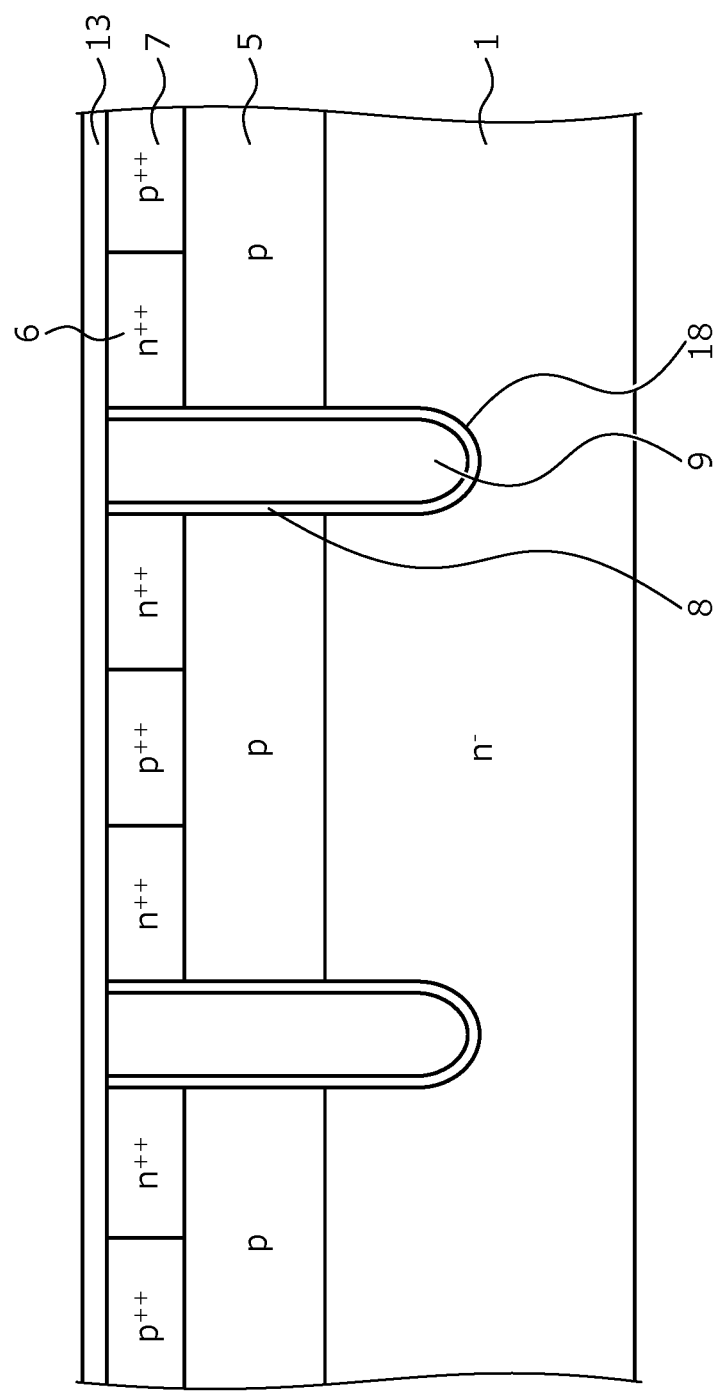
FIG. 8 is a cross-sectional view of the semiconductor device according to the embodiment during manufacture.

Next, heat treatment (annealing) for activating the $p^{++}$-type contact region 7 and the $n^{++}$-type emitter region 6 is performed. The state up to here is depicted in FIG. 8. Here, similarly to a case of annealing when the thermal oxide film 13 is formed, a heavy metal diffuses in the $p^{++}$-type contact regions 7 and the $n^{++}$-type emitter regions 6. However, as compared to a case where a heavy metal diffuses in the p-type base layer 5 that forms a channel, effects on the characteristics of the semiconductor device are minor and therefore, the characteristics of the semiconductor device may be maintained at predetermined values. Further, the sequence in which the $p^{++}$-type contact region 7 and the $n^{++}$-type emitter region 6 are formed may be variously modified. Further, the $n^{++}$-type emitter region 6 and the $p^{++}$-type contact region 7 may be formed directly after the thermal oxide film 13 is formed.

Figure 9:
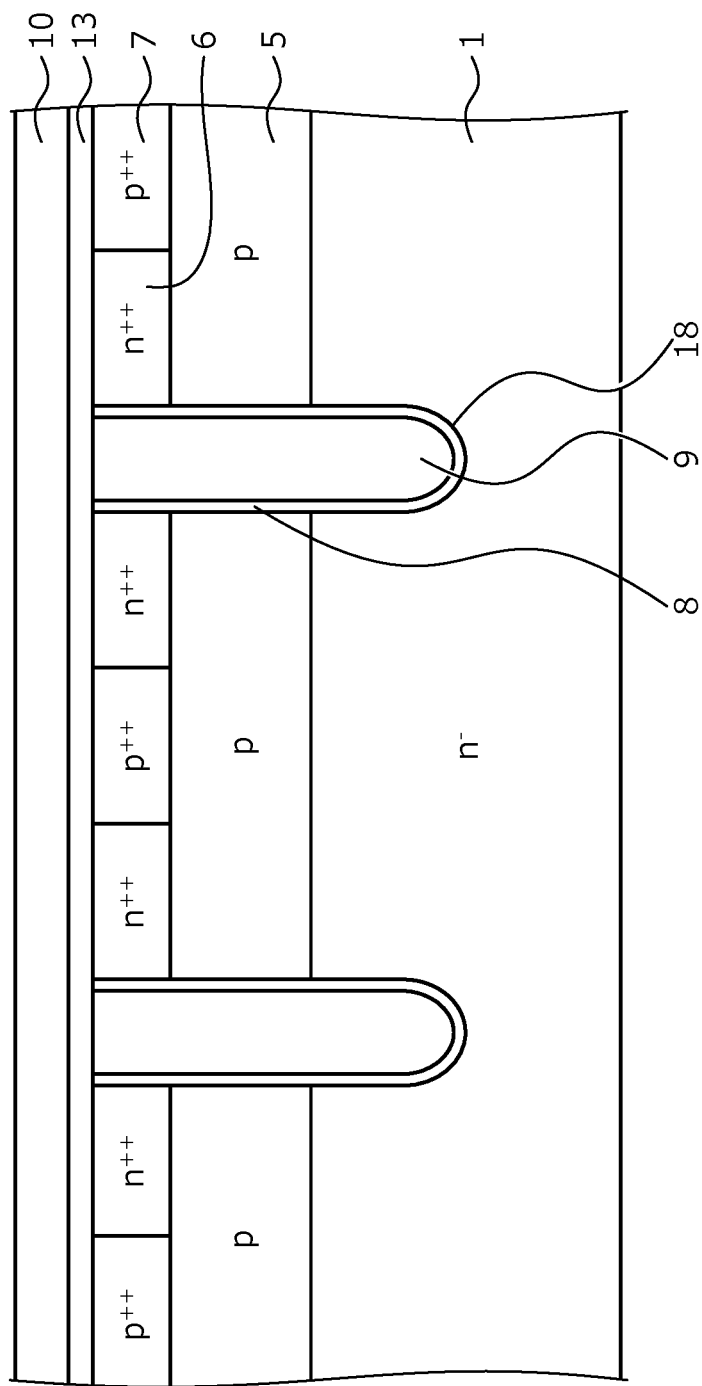
FIG. 9 is a cross-sectional view of the semiconductor device according to the embodiment during manufacture.

Next, the interlayer insulating film 10 is formed so as to cover the thermal oxide film 13. The interlayer insulating film 10 may be formed by sequentially stacking a HTO film and a BPSG film. The stacked structure of the HTO film and the BPSG film enables diffusion of a dopant contained in the BPSG film to be prevented by the HTO film. Further, the interlayer insulating film 10 may be formed by a HTO film or a BPSG film. The state up to here is depicted in FIG. 9.

Figure 10:
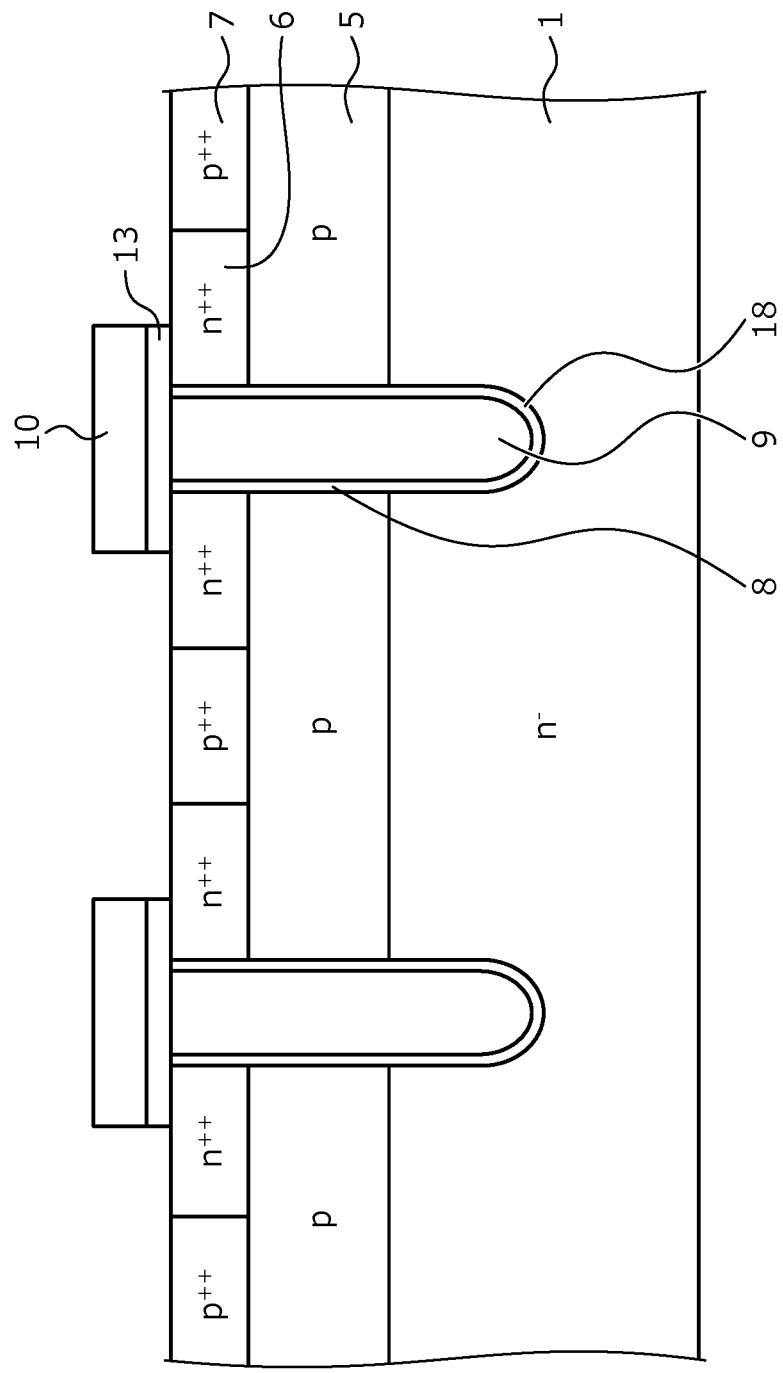
FIG. 10 is a cross-sectional view of the semiconductor device according to the embodiment during manufacture.

Next, the thermal oxide film 13 and the interlayer insulating film 10 are patterned, and plural contact holes are formed penetrating the interlayer insulating film 10 and the thermal oxide film 13 in the depth direction. In a semiconductor device such as the IGBT having the stripe-shaped trench structure depicted in FIG. 1, the contact hole is a groove having a striped shape, a grid-shape, etc. The depth direction is a direction from the front surface of the $n^{-}$-type drift layer 1, toward the rear surface. In each of the contact holes, the $n^{++}$-type emitter region 6 and the $p^{++}$-type contact region 7 are exposed. The state up to here is depicted in FIG. 10.

Figure 11:
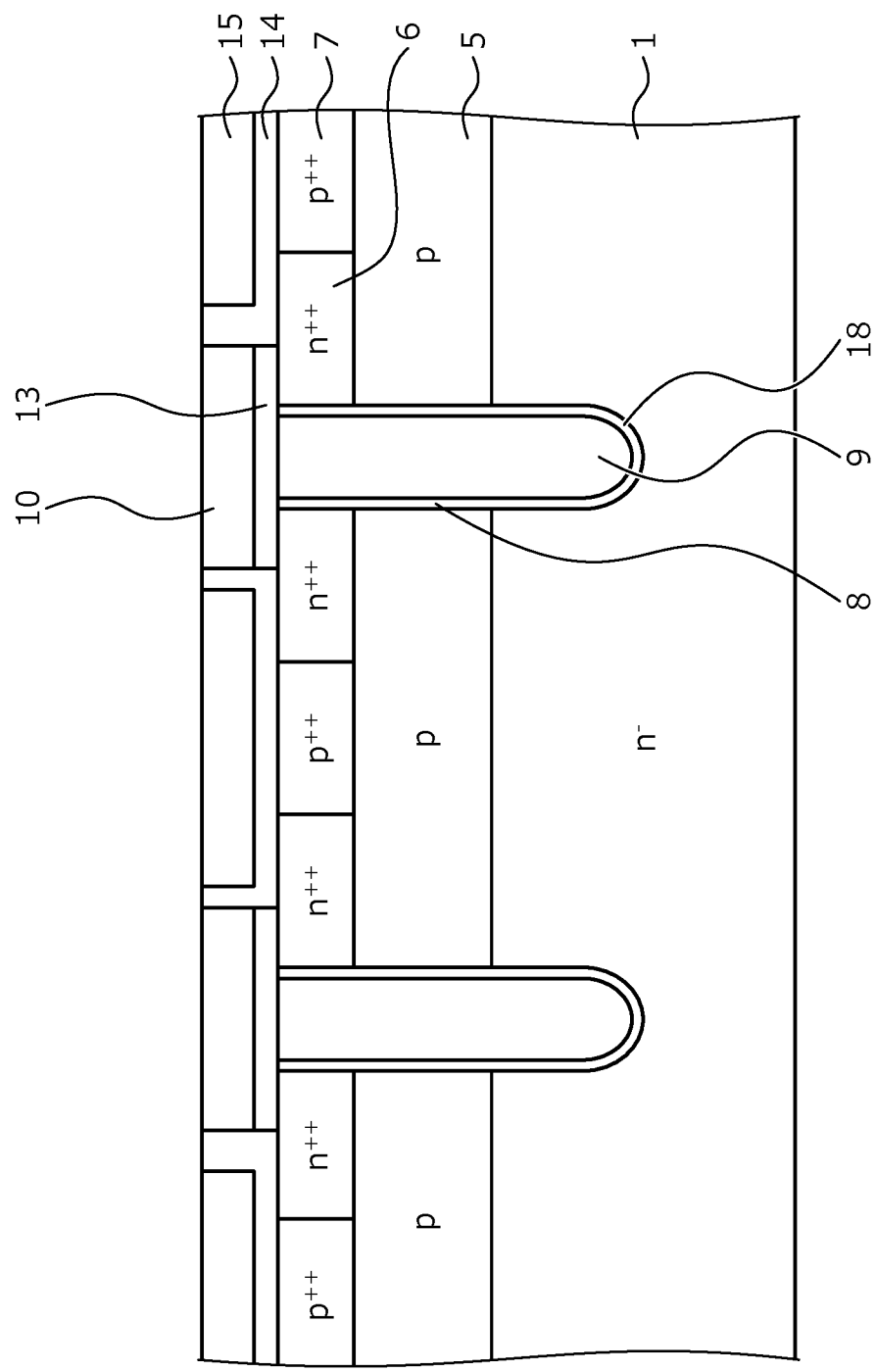
FIG. 11 is a cross-sectional view of the semiconductor device according to the embodiment during manufacture.

Next, the barrier metal 14 is formed by a sputtering method so as to be embedded in the contact holes. The barrier metal 14, for example, is formed by stacked layers of Ti and TiN. Next, the metal plug 15 is formed in the barrier metal 14. The metal plug 15 is formed by a CVD method using a metal halide. When the metal plug 15 is a tungsten plug, for example, by a CVD method, the metal plug 15 is formed using a reduction reaction of $WF_6$ gas and $H_2$ gas and by embedding tungsten. Further, tungsten plug may be formed using a reduction reaction of tungsten hexachloride (WCl$_6$) gas and H$_2$ gas. The metal plug 15 may be a molybdenum plug and in this case, molybdenum hexafluoride (MoF$_6$) gas or molybdenum hexachloride (MoCl$_6$) gas is used, forming the molybdenum plug. The state up to here is depicted in FIG. 11.

Next, the emitter electrode 11 is formed on the barrier metal 14 and the metal plug 15. The emitter electrode 11 is electrically connected to the p-type base layer 5, the n$^{++}$-type emitter region 6, and the p$^{++}$-type contact region 7, via the barrier metal 14 and the metal plug 15. The emitter electrode 11, for example, is formed using Al.

Figure 12:
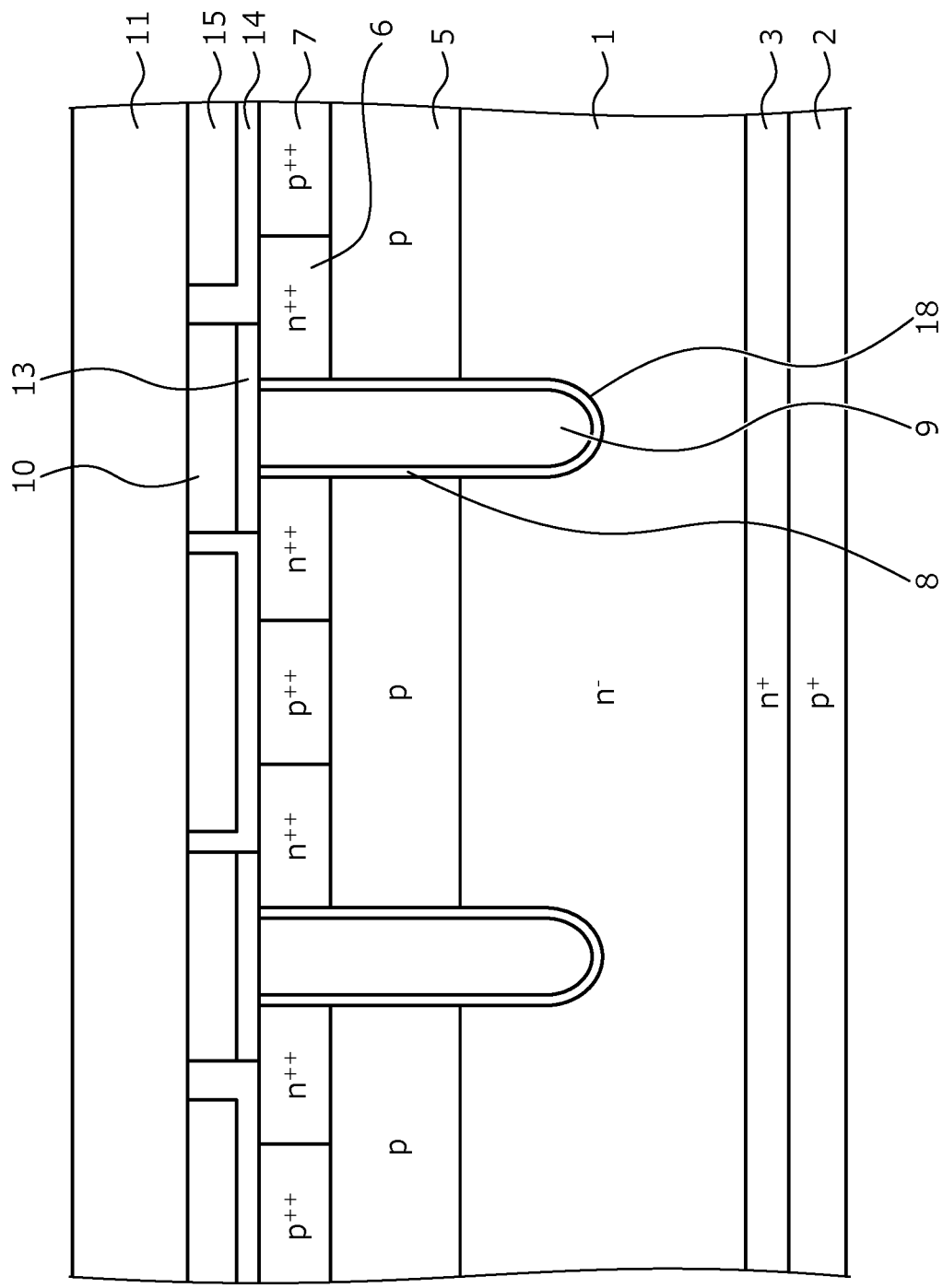
FIG. 12 is a cross-sectional view of the semiconductor device according to the embodiment during manufacture.

Next, the n$^-$-type drift layer 1 is ground from the rear surface side (back grinding), and is ground to a position achieving a product thickness for use as a semiconductor device. Next, by photolithography and ion implantation, the n$^+$-type FS layer 3 is formed at the rear surface side of the n$^-$-type drift layer 1. Next, by photolithography and ion implantation, the p$^+$-type collector layer 2 is formed at a surface of the n$^+$-type FS layer 3. The state up to here is depicted in FIG. 12.

Next, the collector electrode 12 is formed at an entire surface of the p$^+$-type collector layer 2. Thereafter, the semiconductor wafer is cut (diced) into individual chips, whereby the IGBT chip (semiconductor chip) depicted in FIG. 1 is completed.

Further, in the method of manufacturing the semiconductor device according to the embodiment, the n$^{++}$-type emitter region 6 and the p$^{++}$-type contact region 7 may be formed before the gate insulating film 8 is selectively removed. In this case, processes are performed up to implanting at the front surface side of the n$^-$-type drift layer 1, a p-type impurity into a portion that constitutes the p-type base layer 5 (refer to FIG. 5).

Figure 13:
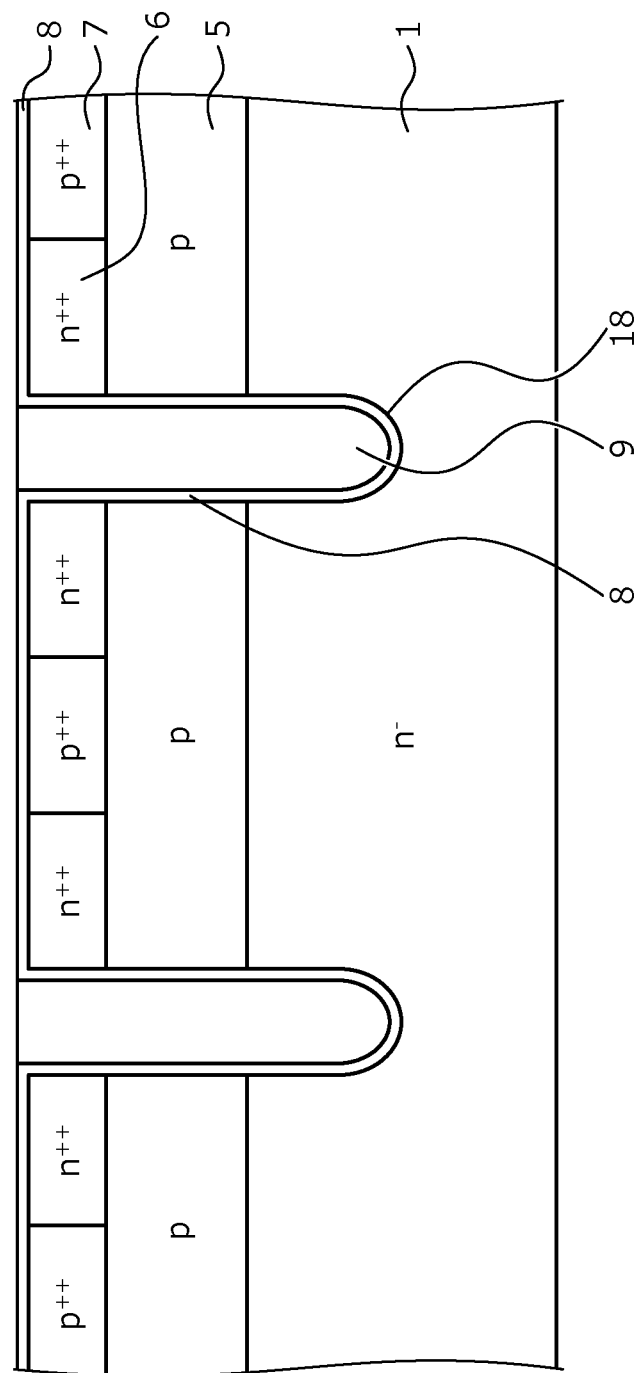
FIG. 13 is a cross-sectional view of the semiconductor device according to the embodiment during manufacture.

Next, by photolithography and ion implantation, the p$^{++}$-type contact region 7 is selectively formed at a surface of the p-type base layer 5. Next, by photolithography and ion implantation, the n$^{++}$-type emitter region 6 is selectively formed at a surface of the p-type base layer 5. Further, the sequence in which the p$^{++}$-type contact region 7 and the n$^{++}$-type emitter region 6 are formed may be variously modified. Further, the n$^{++}$-type emitter region 6 and the p$^{++}$-type contact region 7 may be formed directly after the p-type base layer 5 is formed. The state up to here is depicted in FIG. 13.

Figure 14:
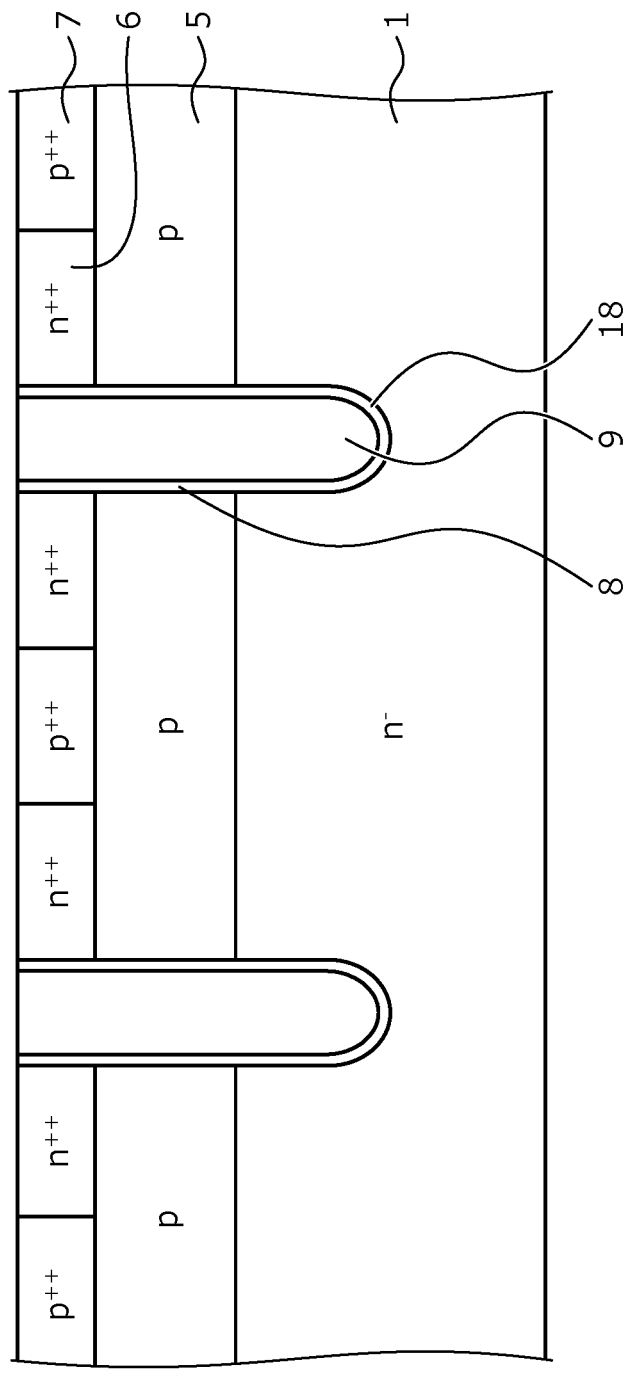
FIG. 14 is a cross-sectional view of the semiconductor device according to the embodiment during manufacture.

Next, the gate insulating film 8 that is formed on the front surface of the n$^-$-type drift layer 1 is removed. The state up to here is depicted in FIG. 14. Next, a heat treatment (annealing) for activating the p-type base layer 5, the p$^{++}$-type contact region 7, and the n$^{++}$-type emitter region 6 is performed. The heat treatment is performed in an oxygen (O$_2$) atmosphere, whereby the thermal oxide film 13 is formed at the front surfaces of the p-type base layer 5, the p$^{++}$-type contact region 7, and the n$^{++}$-type emitter region 6. Thereafter, the process of forming the interlayer insulating film 10 so as to cover the thermal oxide film 13 (refer to FIG. 9) and subsequent processes are performed, whereby the IGBT chip (semiconductor chip) depicted in FIG. 1 is completed.

As described above, according to the embodiment, the thermal oxide film is provided between the silicon substrate and the interlayer insulating film. As a result, when a metal plug is formed in a region where the side wall of the barrier metal is thin and the barrier property is weak, even when the interlayer insulating film is etched by a halide gas, etc., the possibility that the halide gas will reach the silicon substrate is significantly reduced. Therefore, electrical characteristics of the semiconductor device are not impaired, the yield of the semiconductor device improves, and the yield rate may be maintained at a predetermined value.

In the foregoing, various modifications are possible within a range not departing from the spirit of the invention. For example, in the embodiments described, dimensions, impurity concentrations, etc. of parts may be set according to necessary specifications. Further, in the embodiments described, while a trench-gate semiconductor device is described as an example, without limitation hereto, application is further possible to semiconductor devices having a vertical planar gate structure. Further, in the embodiments described, while an IGBT is described as an example, without limitation hereto, wide application is possible to various types of semiconductor devices in which current is conducted and interrupted by gate driving control based on a predetermined gate threshold voltage. For example, use of a semiconductor substrate of a conductivity type different from that of the IGBT enables application to a metal oxide semiconductor field effect transistor (MOSFET). Further, in the embodiments, while the first conductivity type is an n-type and the second conductivity type is a p-type, the present invention is similarly implemented when the first conductivity type is a p-type and the second conductivity type is an n-type.

In the embodiments described, the thermal oxide film is provided between the silicon substrate and the interlayer insulating film. As a result, when the metal plug is formed at a region where the side wall of the barrier metal is thin and the barrier property is weak, even if the interlayer insulating film is etched by halide gas, etc., the etching rate by the halide gas, etc. is lower for the thermal oxide film than for the interlayer insulating film and therefore, the possibility that the halide gas will reach the silicon substrate is significantly reduced. Therefore, electrical characteristics of the semiconductor device are not impaired, the yield of the semiconductor device improves, and the yield rate may be maintained at a predetermined value.

The method of manufacturing the semiconductor device and the semiconductor device according to the embodiments of the present invention achieve an effect in that when a metal plug is formed in a contact hole, instances may be prevented where the silicon substrate is etched and as a consequence, the yield of the semiconductor device is reduced.

As described, the semiconductor device and the method of manufacturing the semiconductor device according the present invention are useful for high-voltage semiconductor devices used in power converting equipment, power supply devices such as in various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a first semiconductor layer of a first conductivity type;
   a second semiconductor layer of a second conductivity type, provided at a first surface of the first semiconductor layer;
   a third semiconductor layer of the first conductivity type, selectively provided at a surface of the second semiconductor layer;
   a gate electrode embedded in a trench, via a gate insulating film, the trench penetrating the third semiconductor layer and the second semiconductor layer, and reaching the first semiconductor layer;

a thermal oxide film provided on the third semiconductor layer, the thermal oxide film having a thickness that is less than a thickness of the gate insulating film;

an interlayer insulating film provided on the thermal oxide film, a contact hole penetrating through the thermal oxide film and the interlayer insulating film;

a barrier metal provided on an inner surface of the contact hole;

a metal plug embedded in the contact hole on the barrier metal; and a first electrode electrically connected to the third semiconductor layer and the second semiconductor layer, via the barrier metal and the metal plug, wherein the thickness of the thermal oxide film is greater than 30 nm.

2. The semiconductor device according to claim 1, wherein the interlayer insulating film is any one of a high temperature oxide (HTO) film, a borophosphorsilicate glass (BPSG) film, or a stacked layer structure of an HTO film and a BPSG film.

3. The semiconductor device according to claim 1, further comprising:
a fourth semiconductor layer of the second conductivity type, provided at a second surface of the first semiconductor layer, the second surface being a surface opposite to the first surface; and
a second electrode electrically connected to the fourth semiconductor layer.

4. A semiconductor device, comprising:
a first semiconductor layer of a first conductivity type;
a second semiconductor layer of a second conductivity type, provided at a first surface of the first semiconductor layer;
a third semiconductor layer of the first conductivity type, selectively provided at a surface of the second semiconductor layer;
a gate electrode embedded in a trench, via a gate insulating film, the trench penetrating the third semiconductor layer and the second semiconductor layer, and reaching the first semiconductor layer;
a thermal oxide film provided on the third semiconductor layer, the thermal oxide film having a thickness that is less than a thickness of the gate insulating film;
an interlayer insulating film provided on the thermal oxide film, a contact hole penetrating through the thermal oxide film and the interlayer insulating film;
a barrier metal provided on an inner surface of the contact hole;
a metal plug embedded in the contact hole on the barrier metal; and
a first electrode electrically connected to the third semiconductor layer and the second semiconductor layer, via the barrier metal and the metal plug, wherein
the third semiconductor layer contains arsenic (As) as an impurity, and the thickness of the thermal oxide film is at most 50 nm.

5. A semiconductor device according to claim 1, comprising:
a first semiconductor layer of a first conductivity type;
a second semiconductor layer of a second conductivity type, provided at a first surface of the first semiconductor layer;
a third semiconductor layer of the first conductivity type, selectively provided at a surface of the second semiconductor layer;
a gate electrode embedded in a trench, via a gate insulating film, the trench penetrating the third semiconductor layer and the second semiconductor layer, and reaching the first semiconductor layer;
a thermal oxide film provided on the third semiconductor layer, the thermal oxide film having a thickness that is less than a thickness of the gate insulating film;
an interlayer insulating film provided on the thermal oxide film, a contact hole penetrating through the thermal oxide film and the interlayer insulating film;
a barrier metal provided on an inner surface of the contact hole;
a metal plug embedded in the contact hole on the barrier metal; and
a first electrode electrically connected to the third semiconductor layer and the second semiconductor layer, via the barrier metal and the metal plug, wherein
the third semiconductor layer contains phosphorus (P), and the thickness of the thermal oxide film is at most 120 nm.

6. The semiconductor device according to claim 1, wherein the thickness of the thermal oxide film is at most 35 nm.

7. The semiconductor device according to claim 1, wherein the thickness of the gate insulating film is in a range from 100 nm to 150 nm.

* * * * *